United States Patent
Chen et al.

(10) Patent No.: US 8,441,053 B2
(45) Date of Patent: May 14, 2013

(54) VERTICAL CAPACITOR-LESS DRAM CELL, DRAM ARRAY AND OPERATION OF THE SAME

(75) Inventors: Hui-Huang Chen, Changhua County (TW); Chih-Yuan Chen, Yilan County (TW); Chun-Cheng Chen, Changhua County (TW); Ching-Ching Tsai, Taipei (TW); Ting-Jyun He, Taipei County (TW); Tai-Liang Hsiung, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 314 days.

(21) Appl. No.: 12/905,100

(22) Filed: Oct. 15, 2010

(65) Prior Publication Data

US 2012/0092925 A1 Apr. 19, 2012

(51) Int. Cl.
*H01L 27/108* (2006.01)
*H01L 29/94* (2006.01)
*H01L 21/70* (2006.01)
*G11C 11/34* (2006.01)
*G11C 7/00* (2006.01)

(52) U.S. Cl.
USPC ............ 257/296; 257/E27.084; 257/E27.06; 257/368; 365/182; 365/222

(58) Field of Classification Search .................. 257/296, 257/E27.084, E27.06, 368; 365/182, 222
See application file for complete search history.

(56) References Cited

U.S. PATENT DOCUMENTS

| | | | |
|---|---|---|---|
| 6,956,256 B2 | 10/2005 | Forbes | |
| 7,488,627 B1 | 2/2009 | Nemati et al. | |
| 2008/0225588 A1* | 9/2008 | Jin et al. | 365/182 |
| 2009/0022003 A1* | 1/2009 | Song et al. | 365/222 |
| 2009/0147580 A1* | 6/2009 | Lee | 365/185.08 |
| 2009/0213675 A1* | 8/2009 | Shino | 365/205 |

* cited by examiner

*Primary Examiner* — Hoai V Ho
*Assistant Examiner* — Tri Hoang
(74) *Attorney, Agent, or Firm* — Jianq Chyun IP Office

(57) ABSTRACT

A vertical capacitor-less DRAM cell is described, including: a source layer having a first conductivity type, a storage layer disposed on the source layer and having a second conductivity type, an active layer disposed on the storage layer and having the first conductivity type, a drain layer disposed on the active layer and having the second conductivity type, an address gate disposed beside the active layer and separated from the same by a first gate dielectric layer, and a storage gate disposed beside the storage layer and separated from the same by a second gate dielectric layer. The DRAM cell can be written by turning on the MOSFET formed by the storage layer, the active layer, the drain layer, the first gate dielectric layer and the address gate to inject carriers into the storage layer from the active layer.

16 Claims, 3 Drawing Sheets

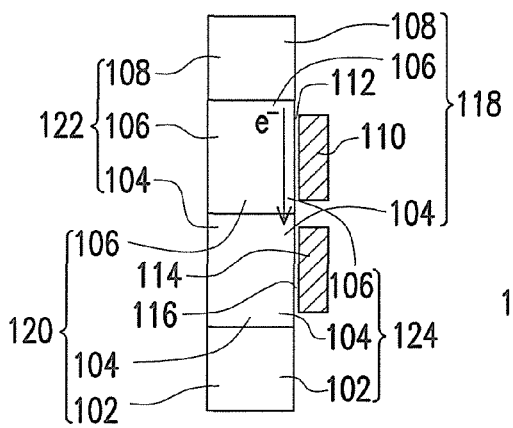
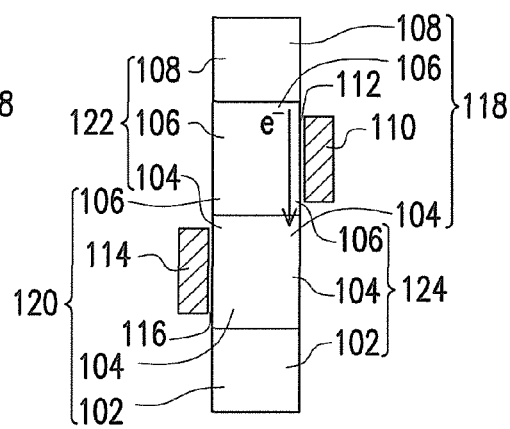
FIG. 1A  FIG. 1B
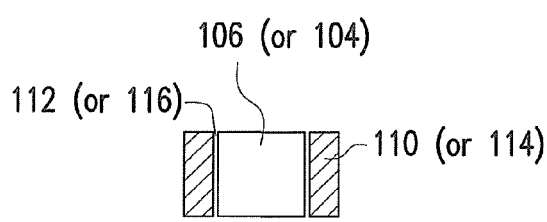
FIG. 1C
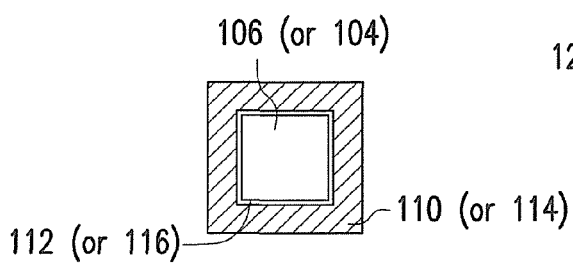
FIG. 1D
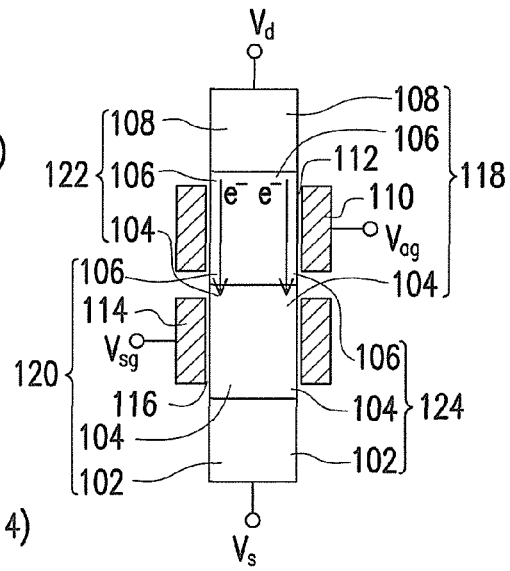
FIG. 1E
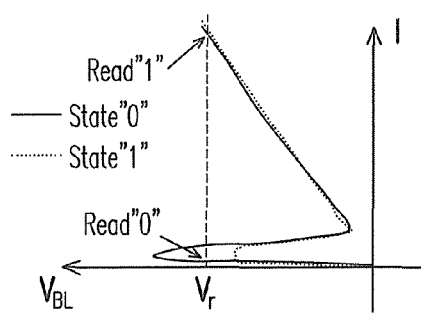
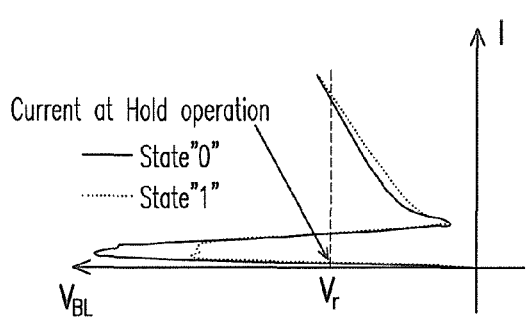
FIG. 2  FIG. 3

VERTICAL CAPACITOR-LESS DRAM CELL, DRAM ARRAY AND OPERATION OF THE SAME

BACKGROUND OF THE INVENTION

1. Field of Invention

This invention relates to a semiconductor device and the operation thereof, and more particularly to a vertical capacitor-less dynamic random access memory (DRAM) cell, a DRAM array based on the cells, and a method of operating the DRAM cell.

2. Description of Related Art

A traditional DRAM cell includes an access transistor and a capacitor coupled thereto, therefore suffering from a complicated fabricating process and taking a larger lateral area that limits the integration degree and the data storage volume. For these issues, capacitor-less DRAM has been provided.

Capacitor-less DRAM cells store data by floating body effect, and are classified into planar and vertical types. A planar capacitor-less DRAM cell includes a planar MOS transistor on a SOI substrate, and a vertical capacitor-less DRAM cell includes a vertical MOS transistor including stacked source, active and drain layers. Both types of cells are written by gate-induced drain leakage (GIDL) or impact ionization and thus have a gate overlapping the source/drain (S/D) and a heavier S/D junction, so that the requirement to gate dielectric quality is high and the junction leakage is high due to the S/D-gate overlap. Moreover, the planar capacitor-less DRAM cell further suffers from a large lateral area, and the vertical capacitor-less DRAM cell further suffers from high power consumption in the impact ionization writing mechanism.

SUMMARY OF THE INVENTION

In view of the foregoing, this invention provides a structure of a vertical capacitor-less DRAM cell.

This invention also provides a DRAM array based on a plurality of the vertical capacitor-less DRAM cells of this invention.

This invention further provides a method of operating the vertical capacitor-less DRAM cell of this invention.

The vertical capacitor-less DRAM cell of this invention includes a source layer having a first conductivity type, a storage layer disposed on the source layer and having a second conductivity type, an active layer disposed on the storage layer and having the first conductivity type, a drain layer disposed on the active layer and having the second conductivity type, an address gate disposed beside the active layer and separated from the same by a first gate dielectric layer, and a storage gate disposed beside the storage layer and separated from the same by a second gate dielectric layer.

In some embodiments, the address gate does not overlap the storage layer or the drain layer.

The address gate may be disposed on two opposite sidewalls of the active layer or surround the same. The storage gate may be disposed on two opposite sidewalls of the storage layer or surround the same.

In some embodiments, the first conductive type is p-type and the second one is n-type. In other embodiments, the first conductive type is n-type and the second one is p-type.

The capacitor-less DRAM array of this invention includes a plurality of the above vertical memory cells of this invention arranged in rows and columns, a plurality of word lines each coupled with the address gates of a column of memory cells, and a plurality of bit lines each coupled with the drain layers of a row of memory cells.

The capacitor-less DRAM array may further include a common source line (CSL) coupled with the source layers of the memory cells. In addition, the storage gates of all the memory cells may be a plurality of portions of a common storage gate.

In the vertical capacitor-less DRAM cell of this invention, the storage layer, the active layer, the drain layer, the first gate dielectric layer and the address gate form a first metal-oxide-semiconductor field-effect transistor (MOSFET), the source layer, the storage layer, the active layer, the second gate dielectric layer and the storage gate form a second MOSFET, the storage layer, the active layer and the drain layer form a first bipolar junction transistor (BJT), and the source layer, the storage layer and the active layer form a second BJT. The write operation of the cell includes applying a write voltage of 0-state or 1-state to the drain layer, a first voltage to the address gate, a second voltage to the storage gate and a third voltage to the source layer, in a manner such that the first MOSEFT is turned on and the second MOSFET, the first BJT and the second BJT are off.

A read operation after the write operation may include: applying a fourth voltage between the write voltages of the 0-state and the 1-state to the drain layer, a fifth voltage to the address gate, the second voltage to the storage gate and the third voltage to the source layer, in a manner such that the first MOSFET and the second MOSFET are off and the first BJT and the second BJT are turned on or off depending on the written state, and determining the written storage state based on the cell current.

A hold operation after the above write operation may include: applying a fourth voltage between the write voltages of the 0-state and the 1-state to the drain layer, a sixth voltage to the address gate, the third voltage to the storage gate and the third voltage to the source layer, in a manner such that the first MOSFET, the second MOSFET, the first BJT and the second BJT are all off.

A refresh operation after the above write operation includes: a read step similar to the above read operation for determined the written state, and a rewrite step similar to the above write operation for rewriting the determined state.

Since a storage layer is inserted between the active layer and the source layer and the memory cell is written by current injection from the first MOSFET instead of GIDL or impact ionization in this invention, the requirement to the gate dielectric quality is lower, and the address gate does not have to overlap the drain layer.

In order to make the aforementioned and other objects, features and advantages of this invention comprehensible, a preferred embodiment accompanied with figures is described in detail below.

BRIEF DESCRIPTION OF THE DRAWINGS

FIGS. 1A and 1B illustrate vertical-sectional views of two vertical capacitor-less DRAM cells according to two embodiments of this invention, FIGS. 1C-1D illustrate transverse-sectional views of two vertical capacitor-less DRAM cells according to two other embodiments of this invention, and FIG. 1E illustrates a vertical sectional view of an example of the vertical capacitor-less DRAM cell illustrated in FIG. 1C or 1D.

FIG. 2 illustrates the I-V curve of a vertical capacitor-less DRAM cell in a read operation according to an embodiment of this invention.

FIG. 3 illustrates the I-V curve of a vertical capacitor-less DRAM cell in a hold operation according to an embodiment of this invention.

DESCRIPTION OF EMBODIMENTS

Figure 4:
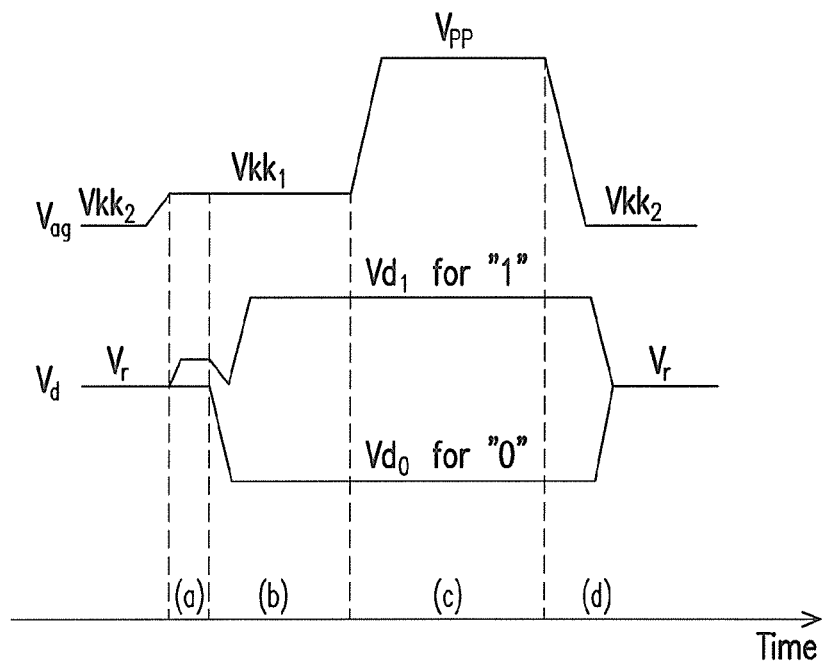
FIG. 4 illustrates a voltage scheme for a refresh operation of a vertical capacitor-less DRAM cell according to an embodiment of this invention.

This invention is further described with the following embodiment, which is not intended to limit the scope thereof. For example, the source layers or the storage gates of the memory cells in the capacitor-less DRAM array may not be formed in an integral and may alternatively be formed as separate source lines or gate lines or be connected to separate source lines or gate lines.

Referring to FIG. 1A, the vertical capacitor-less DRAM cell include a source layer 102 having a first conductivity type, a storage layer 104 disposed on the source layer 102 and having a second conductivity type, an active layer 106 disposed on the storage layer 104 and having the first conductivity type, a drain layer 108 disposed on the active layer 106 and having the second conductivity type, an address gate 110 disposed beside the active layer 106 and separated from the active layer 106 by a first gate dielectric layer 112, and a storage gate 114 disposed beside the storage layer 104 and separated from the storage layer 104 by a second gate dielectric layer 116.

It is possible that the first conductive type is p-type and the second one is n-type, or the first conductive type is n-type and the second one is p-type. The source layer 102, the storage layer 104, the active layer 106 and the drain layer 108 may each include doped poly-Si, implanted silicon, epitaxial silicon, or SiGe. The source layer 102 may have a thickness of 50-200 nm. The storage layer 104 may have a thickness of 20-150 nm. The active layer 106 may have a thickness of 20-150 nm. The drain layer 108 may have a thickness of 20-200 nm. The two gate dielectric layers 112 and 116 may be formed simultaneously or in different steps, each of which may include $SiO_2$ or other insulator material, such as $Si_3N_4$ or $Al_2O_3$, etc.

The storage layer 104, the active layer 106, the drain layer 108, the first gate dielectric layer 112 and the address gate 110 form a first MOSFET 118. The source layer 102, the storage layer 104, the active layer 106, the second gate dielectric layer 116 and the storage gate 114 form a second MOSFET 120. The storage layer 104, the active layer 106 and the drain layer 108 form a first BJT 122. The source layer 102, the storage layer 104 and the active layer 106 form a second BJT 124. Such structure is similar to a thyristor structure as described in the U.S. Pat. No. 7,488,627 and has electrical behaviors similar to those of the thyristor.

Though the address gate 110 and the storage gate 114 are disposed at the same side of the structure 104+106, they may alternatively be disposed at different sides of the same, as shown in FIG. 1B. In an embodiment, the address gate 110 is disposed on two opposite sidewalls of the active layer 106 or surrounds the same, and/or the storage gate 114 is disposed on two opposite sidewalls of the storage layer 104 or surrounds the same, as shown in FIGS. 1C and 1D.

It is possible that the address gate 110 is disposed on two opposite sidewalls of the active layer 106 and the storage gate 114 disposed on two opposite sidewalls of the storage layer 104 right under the address gate 110, or the address gate 110 surrounds the active layer 106 and the storage gate 114 surrounds the storage layer 104, as shown in FIG. 1E. It is also possible that the address gate 110 is disposed on two opposite sidewalls of the active layer 106 and the storage gate 114 on two opposite sidewalls of the storage layer 104 under the other pair of opposite sidewalls of the active layer 106.

Exemplary write, read, hold and refresh operations of the above capacitor-less DRAM cell are described below. The voltages applied to the source layer 102, the drain layer 108, the address gate 110 and the storage gate 114 are represented by "Vs", "Vd", "Vag" and "Vsg", respectively, as shown in FIG. 1E. Though a memory cell with the first conductivity type being p-type and the second one being n-type is taken as an example in the following description, the operations of a memory cell with the first conductivity type being n-type and the second one being p-type can be readily derived based on the following descriptions.

In the write operation, a write voltage of 0-state or 1-state is applied to the drain layer 108 (Vd=$Vd_0$ for "0" or $Vd_1$ for "1"), a positive voltage Vpp applied to the address gate 110 (Vag=Vpp), a fixed voltage applied to the storage gate 114 and another fixed voltage applied to the source layer 102, in a manner such that the first MOSEFT is turned on and the second MOSFET, the first BJT and second BJT are off. Thereby, an electron current is generated in the channel in the active layer 106 of the first MOSFET 118 and injected into the storage layer 104, as shown in FIG. 1E, building in the storage layer 104 a potential corresponding to the 0- or 1-state write voltage and Vpp.

In a read operation after the write operation, a voltage Vr between the write voltages of the 0-state and 1-state is applied to the drain layer 108 (Vd=Vr), a negative voltage $Vkk_1$ applied to the address gate 110 (Vag=$Vkk_1$), the same Vsg applied to the storage gate 114 and the same Vs applied to the source layer 102, such that the first MOSFET 118 and the second MOSFET 120 are off and the first BJT 122 and the second BJT 124 are turned on or off depending on the written state. The written state is determined based on the cell current of the vertical capacitor-less DRAM cell.

FIG. 2 illustrates the I-V curve of a vertical capacitor-less DRAM cell in a read operation in an example of this invention. As shown in FIG. 2, the difference between the cell currents of the 0-state and the 1-state is large, so the written state can be easily determined. The large cell current of the 1-state in reading is due to the punch-through between the depletion region formed by the source layer 102 and the storage layer 104 and the thick depletion region formed by the storage layer 104 and the active layer 106 that is mostly located in the storage layer 104.

In a hold operation after the above write operation, the voltage Vr between the write voltages of the 0-state and the 1-state is applied to the drain layer 108 (Vd=Vr), a negative voltage $Vkk_2$ more negative than $Vkk_1$ for reading applied to the address gate 110 (Vag=$Vkk_2$), the same Vsg applied to the storage gate 114 and the same Vs applied to the source layer 102, in a manner such that the first MOSFET 118, the second MOSFET 120, the first BJT 122 and the second BJT 124 are all off.

FIG. 3 illustrates the I-V curve of a vertical capacitor-less DRAM cell in a hold operation in an example of this invention. As shown in FIG. 3, the cell current at the hold operation is the same for the 0-state and the 1-state. The cell current at the hold operation can be adjusted by adjusting the voltage Vag applied to the address gate 110.

Suitable ranges of the above voltages Vd, Vag, Vsg and Vs in the above write, read and hold operations are provided in Table 1. These bias configurations are only for cases where the drain layer, the active layer, the storage layer and the source layer are of n-type, p-type, n-type and p-type, respectively.

TABLE 1

|  | Write | Read | Hold |
|---|---|---|---|
| Vd | $Vd_1$ = 0 V to 2 V<br>$Vd_0$ = −1 V to 1 V | Vr = −2 V to 0 V | Vr = −2 V to 0 V |
| Vag | Vpp = 1 V to 3 V | $Vkk_1$ = −3 V to 0 V | $Vkk_2$ = −5 V to 0 V |
| Vsg | −5 V to 0 V | Same as left | Same as left |
| Vs | −2 V to 2 V | Same as left | Same as left |
| $1^{st}$ MOSFET | On | Off | Off |
| $2^{nd}$ MOSFET | Off | Off | Off |
| $1^{st}$ BJT | Off | On or Off | Off |
| $2^{nd}$ BJT | Off | On or Off | Off |

A refresh operation is performed a certain period of time after the write operation when a certain amount of the charges is lost, including a read step similar to the above read operation for determined the written storage state, and a rewrite step similar to the above write operation for rewriting the determined storage state.

FIG. 4 illustrates a voltage scheme for such a refresh operation of a capacitor-less DRAM cell according to an embodiment of this invention. The stages (a) and (b) in combination correspond to the read step, wherein the potential of the storage layer 104 is transferred to the bit line coupled with the drain layer 108 in the stage (a), and the cell current is sensed in the stage (b) for determination of the previously written state. The stage (c) corresponds to the rewrite step. The stage (d) includes a hold operation as described above performed after the refresh operation.

Figure 5:
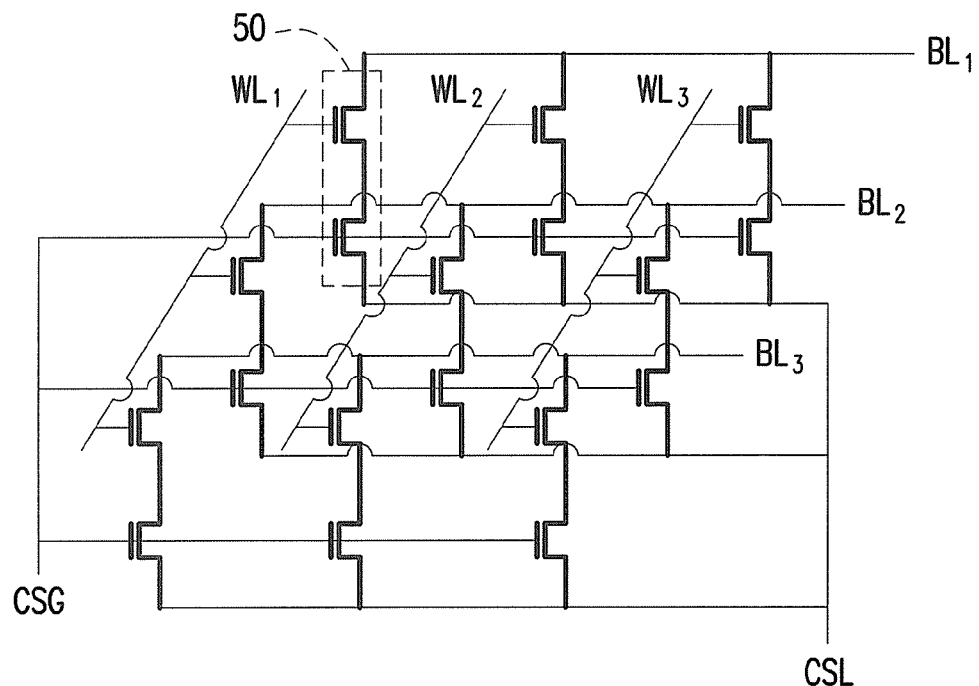
FIG. 5 illustrates a circuit diagram of a capacitor-less DRAM array based on the vertical capacitor-less DRAM cells according to an embodiment of this invention.

FIG. 5 illustrates a circuit diagram of a capacitor-less DRAM array cell according to an embodiment of this invention, wherein a unit 50 corresponds to a memory cell of this invention as shown in FIGS. 1A-1E. As shown in FIG. 5, each of the word lines (e.g., $WL_1$, $WL_2$ and $WL_3$) is coupled to the address gates of a column of cells 50, and each of the bit lines (e.g., $BL_1$, $BL_2$ and $BL_3$) coupled to the drains of a row of cells 50.

The sources of all the memory cells 50 are coupled to a common source line CSL, and the storage states of all the memory cells 50 are coupled to a common storage gate line CSG. It is also possible that the sources of the memory cells 50 are coupled to a plurality of source lines but the sources lines are not coupled to a common source line, and/or the storage states of the memory cells 50 are coupled to a plurality of gate lines but the gate lines are not coupled to a common storage gate line. When a set of Vd, Vag, Vsg and Vs are to be applied to a cell 50 for operation, the same voltages are applied through the corresponding bit line, the corresponding word line, the common storage gate line CSG and the common source line CSL, respectively.

Figure 6A:
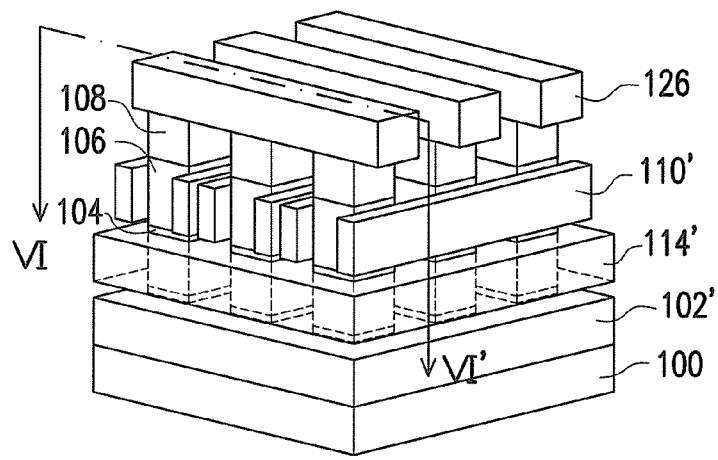
FIG. 6A illustrates a perspective view of capacitor-less DRAM array according to an embodiment of this invention, FIG. 6B/6C illustrates a vertical-sectional/top view of the same, and FIG. 6C' illustrates a modified structure of the above DRAM array where the address gate surrounds the active layer in each memory cell.
Figure 6B:
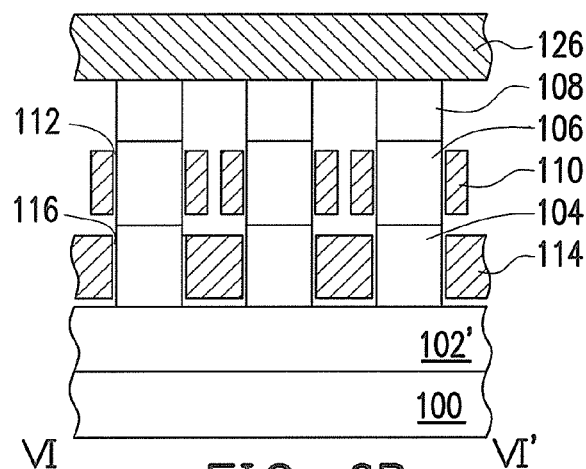

FIG. 6A illustrates a perspective view of a capacitor-less DRAM array according to an embodiment of this invention, and FIG. 6B/6C illustrates a vertical-sectional/top view of the same. As shown in FIGS. 1A-1E and 6A-6B, the source layers 102 of the cells are a plurality of portions of the common source line 102', the storage gates 114 of the cells are a plurality of portions of a common storage gate line 114'. Each word line 110' is disposed at two opposite sides of a column of cells, including the address gates 110 on the sidewalls of the cells in the column. That is, the address gates 110 of a column of memory cells are a plurality of portions of a word line 110, and the address gate 110 of each cell is disposed on two opposite sidewalls of the active layer 106 to form a double-gate structure. Each bit line 126 is coupled with the drain layers 108 of a row of memory cells.

Figure 6C:
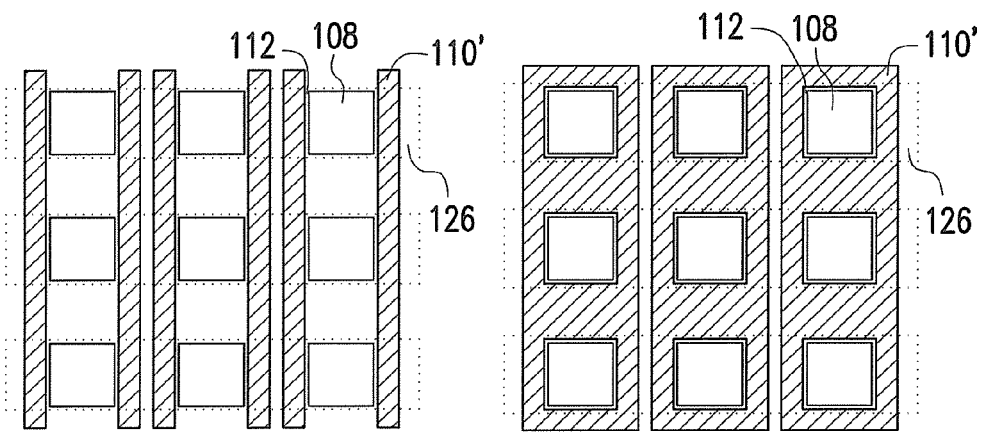

In addition, a word line 110' may alternatively surround the active layers 106 of each memory cell in the corresponding column, i.e., the address gate 110 of each cell may alternatively surround the active layer 106, as shown in FIGS. 6C' and 1D.

Since a storage layer is inserted between the active layer and the source layer and the memory cell is written by current injection from the first MOSFET instead of GIDL or impact ionization in this invention, the requirement to the gate dielectric quality is lower, and the address gate does not have to overlap the drain layer so that the junction leakage is lower and the data holding time is longer.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A vertical capacitor-less DRAM cell, comprising:
   a source layer, having a first conductivity type;
   a storage layer on the source layer, having a second conductivity type;
   an active layer on the storage layer, having the first conductivity type;
   a drain layer on the active layer, having the second conductivity type;
   an address gate beside the active layer, separated from the active layer by a first gate dielectric layer; and
   a storage gate beside the storage layer, separated from the storage layer by a second gate dielectric layer.

2. The vertical capacitor-less DRAM cell of claim 1, wherein the address gate does not overlap the storage layer or the drain layer.

3. The vertical capacitor-less DRAM cell of claim 1, wherein the address gate is disposed on two opposite sidewalls of the active layer, or surrounds the active layer.

4. The vertical capacitor-less DRAM cell of claim 1, wherein the storage gate is disposed on two opposite sidewalls of the storage layer, or surrounds the storage layer.

5. The vertical capacitor-less DRAM cell of claim 1, wherein the first conductive type is p-type and the second conductive type is n-type.

6. The vertical capacitor-less DRAM cell of claim 1, wherein the first conductive type is n-type and the second conductive type is p-type.

7. A capacitor-less DRAM array, comprising:
   a plurality of vertical memory cells arranged in rows and columns, each comprising:
   a source layer, having a first conductivity type;
   a storage layer on the source layer, having a second conductivity type;
   an active layer on the storage layer, having the first conductivity type;
   a drain layer on the active layer, having the second conductivity type;
   an address gate beside the active layer, separated from the active layer by a first gate dielectric layer; and
   a storage gate beside the storage layer, separated from the storage layer by a second gate dielectric layer;

a plurality of word lines, each coupled with the address gates of a column of memory cells; and a plurality of bit lines, each coupled with the drain layers of a row of memory cells.

8. The capacitor-less DRAM array of claim 7, wherein in each of the memory cells, the address gate does not overlap the storage layer or the drain layer.

9. The capacitor-less DRAM array of claim 7, wherein in each of the memory cells, the address gate is disposed on two opposite sidewalls of the active layer, or surrounds the active layer.

10. The capacitor-less DRAM array of claim 7, wherein in each of the memory cells, the storage gate is disposed on two opposite sidewalls of the storage layer, or surrounds the storage layer.

11. The capacitor-less DRAM array of claim 7, wherein the address gate of each of the memory cells is a portion of a corresponding word line.

12. The capacitor-less DRAM array of claim 7, further comprising a common source line coupled with the source layers of all the memory cells.

13. The capacitor-less DRAM array of claim 12, wherein the source layers of all the memory cells are a plurality of portions of the common source line.

14. The capacitor-less DRAM array of claim 7, wherein the storage gates of all the memory cells are a plurality of portions of a common storage gate.

15. The capacitor-less DRAM array of claim 7, wherein the first conductive type is p-type and the second conductive type is n-type.

16. The capacitor-less DRAM array of claim 7, wherein the first conductive type is n-type and the second conductive type is p-type.

* * * * *